US007911062B2

(12) United States Patent
Nakatsuka et al.

(10) Patent No.: US 7,911,062 B2
(45) Date of Patent: Mar. 22, 2011

(54) ELECTRONIC COMPONENT WITH VARYING RIGIDITY LEADS USING PB-FREE SOLDER

(75) Inventors: Tetsuya Nakatsuka, Fujisawa (JP); Koji Serizawa, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 106 days.

(21) Appl. No.: 11/670,499

(22) Filed: Feb. 2, 2007

(65) Prior Publication Data

US 2007/0210139 A1    Sep. 13, 2007

(30) Foreign Application Priority Data

Mar. 7, 2006   (JP) ................... 2006-060432

(51) Int. Cl.
*H01L 29/40* (2006.01)
*H01L 21/60* (2006.01)
*H01L 23/49* (2006.01)

(52) U.S. Cl. ........ 257/773; 257/665; 257/669; 257/672; 257/674; 257/677; 257/678; 257/735; 257/775; 257/E23.01; 257/E23.031; 257/E23.043

(58) Field of Classification Search ............... 257/692, 257/735, 693, 694, 734, 665, 669, 672, 674, 257/677, 678, E32.01, E23.014, E23.031, 257/E23.043, E23.01, 773, 775
See application file for complete search history.

(56) References Cited

U.S. PATENT DOCUMENTS

| | | | | |
|---|---|---|---|---|
| 5,138,431 A * | 8/1992 | Huang et al. | ........... | 257/677 |
| 5,196,725 A * | 3/1993 | Mita et al. | ........... | 257/672 |
| 5,313,095 A | 5/1994 | Tagawa | | |
| 5,637,914 A * | 6/1997 | Tanaka et al. | ........... | 257/666 |
| 5,736,784 A * | 4/1998 | Dove | ........... | 257/692 |
| 5,877,548 A * | 3/1999 | Washida et al. | ........... | 257/690 |
| 5,994,768 A * | 11/1999 | Fogelson | ........... | 257/666 |
| 6,190,939 B1 * | 2/2001 | Burns | ........... | 438/106 |
| 6,342,729 B1 * | 1/2002 | Takenaka et al. | ........... | 257/669 |
| 6,541,702 B2 * | 4/2003 | Miyaki et al. | ........... | 174/529 |
| 2002/0109215 A1 * | 8/2002 | Iwaya et al. | ........... | 257/676 |
| 2002/0145180 A1 * | 10/2002 | Terui et al. | ........... | 257/666 |
| 2003/0157437 A1 * | 8/2003 | Yamamoto et al. | ........... | 430/311 |
| 2004/0124506 A1 * | 7/2004 | Ito et al. | ........... | 257/666 |
| 2004/0232527 A1 * | 11/2004 | Ito et al. | ........... | 257/666 |
| 2007/0096269 A1 * | 5/2007 | Cheng | ........... | 257/666 |

FOREIGN PATENT DOCUMENTS

| | | | |
|---|---|---|---|
| JP | 2782934 B2 | | 4/1992 |
| JP | 2782934 B2 | * | 4/1992 |
| JP | 04-363055 | | 12/1992 |
| JP | 5-299576 | | 11/1993 |
| JP | 06-224353 | | 8/1994 |
| JP | 2003-181631 | | 7/2003 |
| JP | 2005-026393 | | 1/2005 |

OTHER PUBLICATIONS

Japanese Office Action dated Mar. 23, 2010.

* cited by examiner

*Primary Examiner* — N Drew Richards
*Assistant Examiner* — John P. Dulka
(74) *Attorney, Agent, or Firm* — Antonelli, Terry, Stout & Kraus, LLP.

(57) ABSTRACT

The present invention proposes a semiconductor device including a semiconductor chip having a plurality of electrodes, a plurality of leads electrically connected to the plurality of electrodes of the semiconductor chip by bonding wires, and a resin for implementing the semiconductor chip, wherein the plurality of leads are comprised of two or more kinds of leads having different rigidities.

30 Claims, 7 Drawing Sheets

(a)

HALF ETCH LEAD → DISPOSE LEAD → MOLD → CUT LEAD (b)

CROSS-SECTION A-A'

ELECTRONIC COMPONENT WITH VARYING RIGIDITY LEADS USING PB-FREE SOLDER

CROSS-REFERENCE TO RELATED APPLICATIONS

The present application claims priority from Japanese application JP2006-060432 filed on Mar. 7, 2006, the content of which is hereby incorporated by reference into this application.

BACKGROUND OF THE INVENTION

The present invention relates to an electronic component (including a semiconductor device and another chip component) having leads for preventing peeling-off of the component due to the warpage of a substrate during wave-soldering, to a manufacturing method thereof, to electronic equipment having such a semiconductor device mounted thereon and to a manufacturing method thereof.

As a method for soldering of a circuit substrate such as an organic substrate of electrical appliances, a reflow soldering process wherein hot-air is blown onto the circuit substrate so that solder paste printed on electrodes is molten to solder a surface mount device (electronic component), and a wave-soldering process wherein molten solder jet is brought into contact with a bottom surface of the substrate to solder to electrodes of a component lying on the bottom surface of the substrate have become the mainstream. Then, today, products requiring for miscellaneous components to be implemented therein by using both of the processes are increased.

However, when a wave-soldering process follows a reflow soldering process, various problems may occur.

One of the problems is that the solder soldered during the reflow process on connection portions of an electronic component may be molten again due to the effect of heat transferred through a substrate during the subsequent wave-soldering process, and connection strength may lower, causing peeling of the electronic component. This problem occurs frequently, particularly when less-toxic Pb-free solder is used. More specifically, when Sn—Ag—Cu alloy solder or Sn—Ag—Cu—Bi alloy solder used for reflow soldering of a low heat-resistance component is used, low-temperature eutectic phase is created owing to segregation of solder constituents, and therefore a connection portion is easily molten again during the subsequent wave-soldering process. For example, in the case of Sn—Ag—Cu—Bi alloy solder used, low-temperature eutectic phase at a melting point of 138° C. is usually created owing to segregation of solder constituents, and very low-temperature eutectic phase at a melting point of 97° C. is created in the connections connected to connection portions of a connected component in which Pb is mixed. Accordingly, re-melting during the wave-soldering can not be avoided.

Further, another problem is substrate warpage caused by heat during wave-soldering, and when a substrate has a curvature due to the warpage, similar to the problem above, peeling of an electronic component may occur. It is generally said that the larger a size of the electronic component becomes, the more this peeling of the electronic component is likely to occur. It is because that the larger the size of the component is, the greater variations of heights of solder connection portions in the vertical direction (the Z-direction) to a surface of the substrate become.

The problem of re-melting and the problem of substrate warpage above occur concurrently, and their combination makes the problem of peeling of a component appear more significantly during a wave-soldering process after a reflow soldering process.

As a countermeasure against the problem of peeling of a component due to re-melting described above, it has been proposed that Sn—Ag—Cu—In alloy solder is used during a reflow process (for example, see JP-A-2005-26393). Sn—Ag—Cu—In alloy solder allows low-temperature soldering to be carried out and it may be used for reflow soldering of a low heat-resistance component, and on the other hand, In among the constituents of the solder and Sn, the main constituent of the solder, may be likely to form solid solution and the formed solid solution maintains similar properties as the main constituent Sn, so that this solder has a feature that low-temperature eutectic phase having a low-temperature melting point may not be likely to be created, and therefore it is effective.

Further, as another countermeasure, it is assumed that if substrate warpage occurs, nonoccurrence of re-melting does not cause peeling of a component, and it has been proposed that nitrogen gas is blown onto connection portions from the upper surface of a substrate during wave-soldering to cool, thereby preventing re-melting of the connection portions (for example, see JP-A-2003-181631).

BRIEF SUMMARY OF THE INVENTION

However, the art of JP-A-2005-26393 above has a limited range for practical use, because Pb-free solder usable is limited to Sn—Ag—Cu—In alloy solder including In which is a rare metal and high-cost, and another Pb-free solder material may not be fit for use.

Further, in the case of JP-A-2003-181631, sucking in the atmosphere occurs owing to the effect of a nitrogen stream blown onto the upper surface of a substrate in a cooling system, and the ambient atmosphere having a low, required oxygen concentration is broken. This deteriorates the wettability of solder and makes a problem that good connection may not be provided. To solve this problem, a special soldering system is necessary, requiring replacement of the facilities.

From the viewpoint of a specification of components to be connected, it is assumed that the larger a size of the component is, the more peeling is likely to occur, and it may be contemplated that reduction in peeling is achieved by miniaturizing the component.

However, considering substrate warpage caused during wave-soldering that is a factor for occurrence of peeling of a component in implementation of miscellaneous components, if an electronic component has a larger size, leads of the electronic component to be surface mounted are likely to get well-adapted, which contributes to reduction in failure component occurrence, therefore, only miniaturizing a package, in a precise sense, may not be a countermeasure for reduction in peeling.

Then, the present inventors decide that in order to study a mechanism of peeling of an electronic component previously soldered during the subsequent wave-soldering, we, first, investigate peeling force acting on leads of the electronic component per unit area from a substrate, in relationship to a size of various components, when a constant curvature is given to the substrate.

Table 1 shows the experimental result of relation between a maximal value of peeling force (tensile force) acting on the leads of each of the electronic components per unit area from the substrate and the component size when a curvature radius is about 1 m.

Table 1 also shows another experimental result. In this experiment, after each of the components above are actually connected to a substrate (having a thickness of 1.6 mm and four inner layers) by reflow soldering using Sn-3Ag-0.5Cu alloy solder, wave-soldering is performed using Sn-3Ag-0.5Cu molten alloy solder at temperature of 250° C. in various conditions (a transfer speed of a substrate conveyer), and it is examined whether peeling occurs due to an effect of heat or not (when peeling does not occur is shown by "○", and when it occurs, by "X").

TABLE 1

| Surface mount component | | | Component size L (mm) | Lead peeling force σ (N/mm²) | Occurrence of peeling |
|---|---|---|---|---|---|
| Two-sided lead component | Gull wing | SOP32F | 8 | 4.90 | ○ |
| | | SOP44A | 19 | 4.81 | ○ |
| | | SOP32C | 21 | 7.84 | ○ |
| | J-bend | SOJ36A | 23 | 10.81 | ○ |
| Four-sided lead component | Gull wing | FP80Q | 14 | 2.92 | ○ |
| | | FP100B | 14 | 7.00 | ○ |
| | | FP128B | 20 | 5.44 | ○ |
| | | FP144 | 20 | 12.24 | ○ |
| | | TQFP144 | 20 | 14.28 | X |
| | | FP136 (A42) | 20 | 14.28 | X |
| | | FP208 | 28 | 16.00 | X |
| | | FP240 | 32 | 20.89 | X |
| | | FP304 (A42) | 40 | 14.69 | X |
| | J-bend | QFJ52 | 20 | 9.64 | ○ |
| | | QFJ68 | 24 | 14.02 | X |
| | | QFJ84 | 29 | 15.53 | X |

It is seen from this that occurrence of peeling is dependent on a maximal value of the tensile force acting on the leads of each of the electronic components per unit area from the substrate rather than the component size. More specifically, a condition required to maintain soldering connectivity is that when the curvature radius of the substrate is about 1 m, the maximal tensile force per unit area acting on the component leads from the substrate is not greater than about 14 MPa, desirably not greater than 12 MPa. Further, it is known that the value of the maximal tensile force becomes larger as the component size increases, but from the viewpoint of adaptation to substrate warpage, it is affected largely by solid state properties of each of the component leads such as rigidity.

The present inventors thus had knowledge that it was important to adjust rigidity of each lead of a component etc. to prevent occurrence of peeling due to a heat effect during wave-soldering. Then, we tried to make a thickness of all the leads thinner and material of all the leads flexible, but because resistance properties of the entire leads became too weak, a new problem arose that the leads were deformed due to physical pressure during part installation, poor soldering, poor insulation between the leads owing to lead bending or distortion, and the like were caused. In addition, when a length of a lead was made elongated, a similar problem above was caused, further, a problem remained that increase in implementation height on a substrate for implementation might lead to difficulty in realizing miniaturizing.

The present invention is addressed to solving the problems above and to providing an electronic component, especially a semiconductor device and an electronics device, which is downsized and has high connection reliability, although which has miscellaneous components implemented therein with involving a reflow soldering process and a wave-soldering process.

Further features of the invention will be apparent from the description herein and the accompanying drawings.

Representative aspects among those of the present invention disclosed herein will be summarized as follows.

(1) A semiconductor device includes a semiconductor chip having a plurality of electrodes, a plurality of leads electrically connected to the plurality of electrodes of the semiconductor chip using a bonding wire, and a resin for implementing the semiconductor chip, and is characterized in that the plurality of leads are comprised of two or more kinds of leads having different rigidity from each other.

(2) A semiconductor device includes a semiconductor chip having a plurality of electrodes, a plurality of leads electrically connected to the plurality of electrodes of the semiconductor chip using a bonding wire, and a resin for implementing the semiconductor chip, and is characterized in that the plurality of leads includes a first lead group projecting from a first side of the semiconductor chip, a second lead group adjacent to the first lead group and projecting from the first side, and a third lead group between the first lead group and the second lead group and projecting from the first side, and rigidity of the third lead group is higher than that of the first lead group and the second lead group.

(3) An electronics device includes a wiring board and a semiconductor device having a plurality of leads electrically connected to a plurality of electrodes of the wiring board, and is characterized in that the plurality of leads of the semiconductor device include first leads having first rigidity and second leads having second rigidity different from the first rigidity.

These and other objects, features and advantages of the invention will be apparent from the following more particular description of preferred embodiments of the invention, as illustrated in the accompanying drawings.

DETAILED DESCRIPTION OF THE INVENTION

Now, embodiments of the present invention will be explained, especially taking a semiconductor device 1 as an example.

Figure 1:
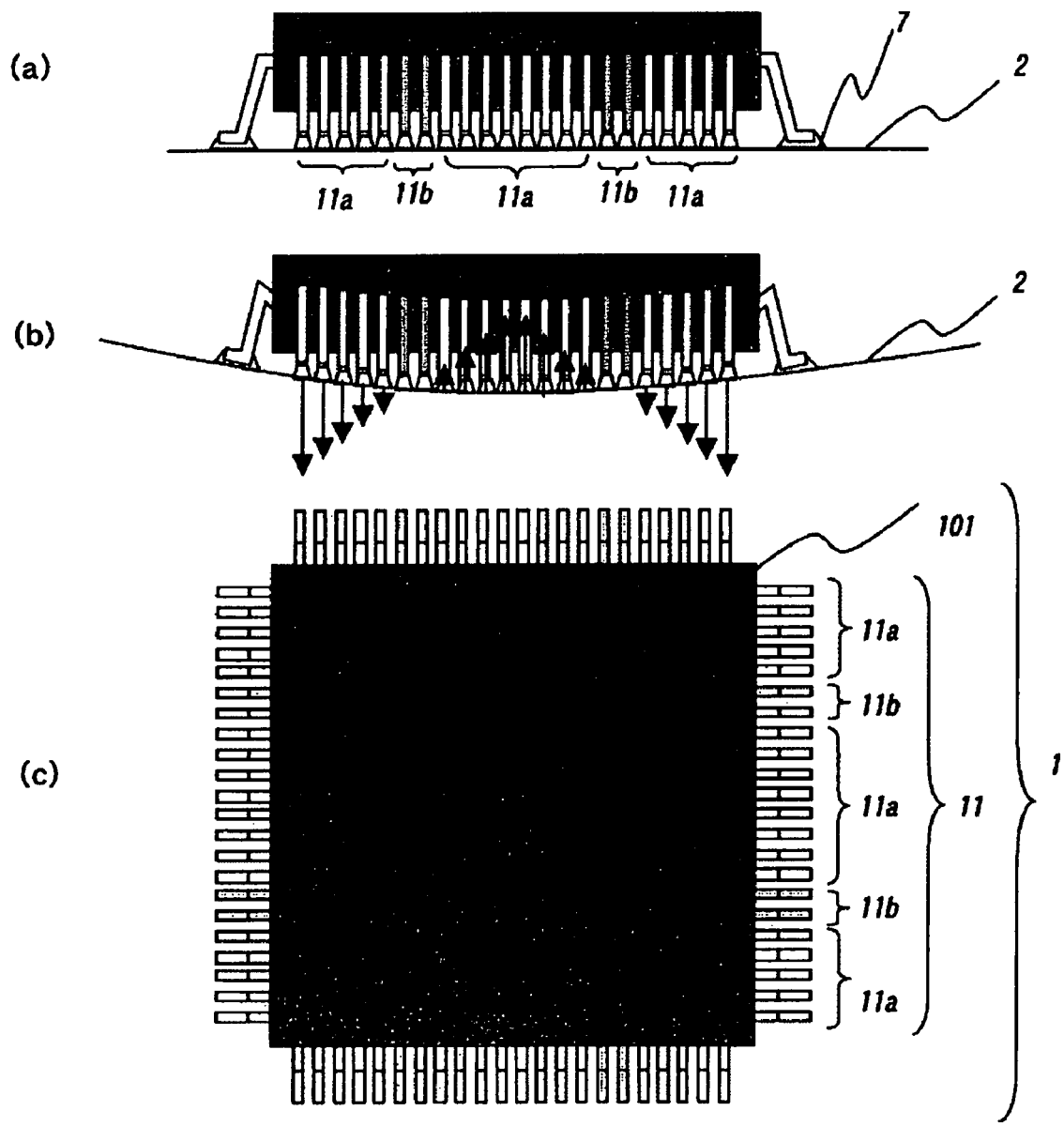
In FIG. 1, (a) is a side view of a lead type semiconductor device implemented on a substrate according to a first embodiment, (b) is a view showing stress acting on the lead type semiconductor device caused by substrate warpage, and (c) is a top view of the lead type semiconductor device according to the first embodiment.

In a first embodiment of the present invention, a semiconductor device includes a first lead 11a electrically connected to an electrode of a semiconductor chip (not shown) and formed of a first material, a second lead 11b formed of a second material different from the first material, and a package portion 101 formed of resin etc. for implementing the semiconductor chip, and FIG. 1 (a) is a side view of the semiconductor device which is connected to a wiring board 2 through a solder connection portion 7.

As shown in FIG. 1 (b), when substrate warpage is caused due to heat during wave-soldering, strong tensile force is generated in the central region of the semiconductor device installed, strong pressing force is generated in an end thereof, and therebetween there is a place where load is scarcely applied and which has a zero-level of load. Therefore, in a portion where the tensile force or pressing force is strongly applied due to warpage of a substrate 2 (portion where it is necessary to easily adapt to displacement in the Z-direction), the lead 11a formed of a low-rigidity material such as a Cu alloy lead is used, and in a portion where the tensile force or pressing force is relatively weak (portion where it is not necessary to easily adapt to displacement in the Z-direction), the lead 11b having a relatively stronger-rigidity material than that of the lead 11a, such as a Alloy 42 (Fe—Ni alloy) lead, is used for purpose of reinforcement of a lead. Thus, by changing material for the lead according to a level of the tensile force or pressing force, lead deformation may be prevented while keeping adaptation to substrate warpage, providing a semiconductor device having high connection reliability during implementation on a substrate.

Further, in this embodiment, because of use of a combination of materials having different mechanical properties from each other, a lead 11 having two or more kinds of rigidity may be produced while features of the lead (width or thickness) are held almost in the same size, and difference in wettability of solder to a lead etc. may not be likely to appear, providing in whole a merit of good connection. Further, occurrence of a bridge or creation of a local large region can be avoided.

In addition, as shown in a top view of FIG. 1 (c), when a semiconductor device has leads in its four sides, all the leads in the four sides may be similarly formed, but not limited to this, only the leads seated in sides opposed to each other may be similarly formed. Further, here, only the leads having two kinds of material are shown, but not limited to this, leads having three or more kinds of rigidity may be used consistent with the objectives above.

Figure 10:
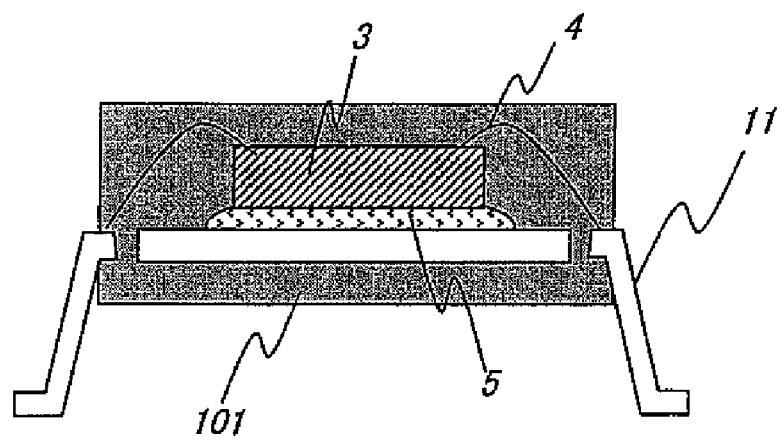
FIG. 10 is a cross-section view of a lead type semiconductor device.

Now, describing relation between a semiconductor chip and a lead in a semiconductor device, for example, as shown in FIG. 10, an arrangement is taken as an example wherein the semiconductor chip 3 is mounted on a tab of a lead frame 11 through a solder connection 5 and an electrode (not shown) is connected to the lead 11 with a bonding wire 4, but the invention is not limited to this. The embodiments described below may be in similar circumstances.

A manufacturing method of the semiconductor device according to the first embodiment will be explained with reference to FIG. 2.

Figure 2:
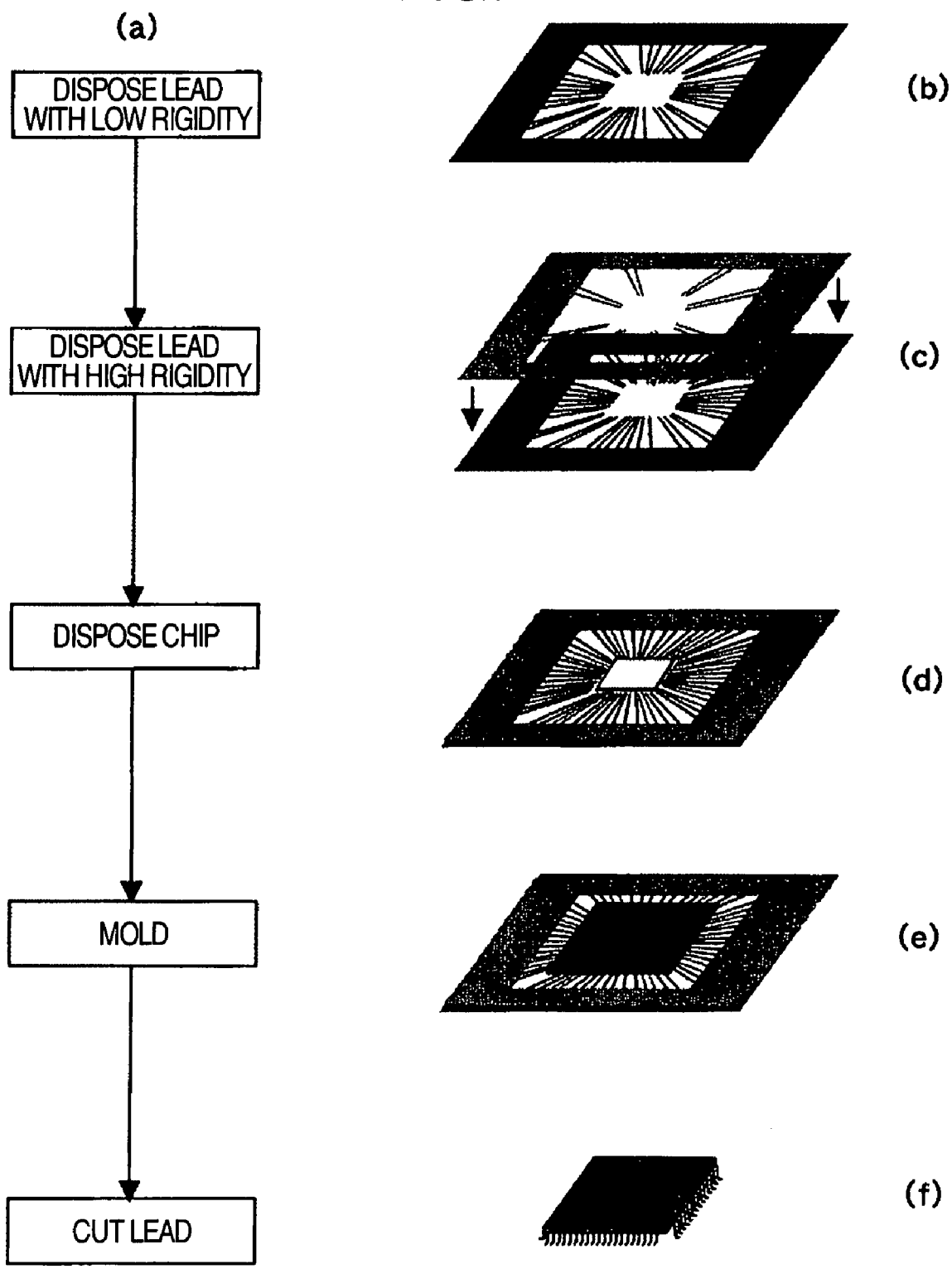
In FIG. 2, (a) is a flow chart illustrating a manufacturing method for the lead type semiconductor device according to the first embodiment, and (b) to (f) are schematic depictions illustrating the manufacturing process.

First, as shown in a flow chart of FIG. 2 (a), the lead frame 11a of low rigidity which has lead ends formed only at the portions where tensile force or pressing force due to substrate warpage is strong, is disposed (FIG. 2 (b)). Next, the lead frame 11b of high rigidity which has lead ends formed only at the portions where tensile force or pressing force due to substrate warpage during implementation on the substrate is weak, is disposed to be superimposed (FIG. 2 (c)). A semiconductor chip 3 is mounted on a tab of the lead frame 11 (FIG. 2 (d)), and electrodes of the semiconductor chip 3 are electrically connected to the respective lead frames through wire bonding. Next, the chip is molded (sealed) with resin etc. to form the package portion 101 (Fig. (e)), and then a predetermined part of the lead frame is cut away (Fig. (f)), thus manufacturing the semiconductor device.

A second embodiment of the invention is similar to the first embodiment except for a method of providing leads having two or more kinds of rigidity.

More specifically, from among a plurality of leads formed of low-rigidity material such as a Cu alloy lead, a leads used at portions where tensile force due to substrate warpage is weak (portions where it is not necessary to easily adapt to displacement in the Z-direction) may be partially solder-plated with Sn—Bi alloy etc. to reinforce rigidity, thus, the leads having two or more kinds of rigidity such as a Cu alloy lead, a Cu alloy lead plated with Sn—Bi alloy or the like may be provided.

In this embodiment, the lead frame to be prepared may be only of one kind of material, therefore, a manufacturing process may become easy, thereby allowing low cost.

Figure 3:
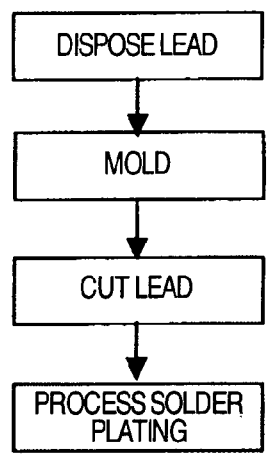
FIG. 3 is a flow chart illustrating a manufacturing method for a lead type semiconductor device according to a second embodiment.

FIG. 3 shows a flow chart illustrating a manufacturing method of the semiconductor device according to this second embodiment.

First, after a semiconductor chip is mounted on a tab of the lead frame, electrodes of the semiconductor chip are electrically connected to lead ends of the lead frame through wire bonding.

Next, after the semiconductor chip portion is molded with resin etc., a part of the lead frame is cut away. Subsequently, only the leads disposed at portions where tensile force due to substrate warpage is weak, are plated with Sn—Bi alloy to reinforce rigidity of the leads, thus manufacturing the semiconductor device according to the second embodiment.

Figure 4:
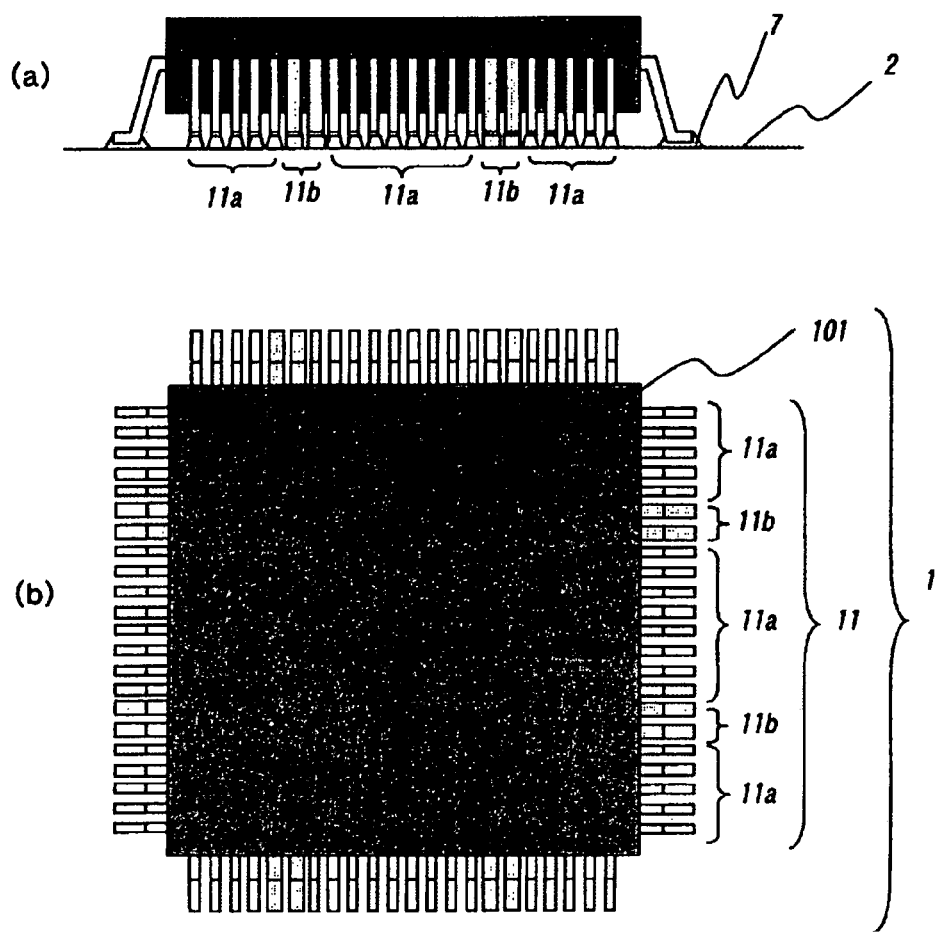
In FIG. 4, (a) is a side view of a lead type semiconductor device implemented on a substrate according to a third embodiment, and (b) is a top view of the lead type semiconductor device of FIG. 4 (a).

In a third embodiment of the invention, a semiconductor device includes leads 11a electrically connected to electrodes of a semiconductor chip (not shown) and having a first width, leads 11b having a width larger than the first width, and a package portion 101 formed of resin etc. for implementing the semiconductor chip, and FIG. 4 (a) is a side view illustrating circumstances in which the semiconductor device is connected to a wiring board 2 through solder connections 7. Further, FIG. 4 (b) is a top view of FIG. 4 (a). The third embodiment of the invention, similar to the second embodiment, is different from the first embodiment in a method of providing the leads having two or more kinds of rigidity, and the width of the leads 11b disposed at portions where tensile force due to substrate warpage is weak, is made larger than that of the leads 11a disposed at other portions, providing reinforced rigidity.

In this embodiment, the leads having various kinds of rigidity may be formed of one kind of material, therefore, a sheet of a lead frame may be easily manufactured only by etching.

Further, leads having two or more kinds of rigidity may be not only formed by variation of a lead width, but they may be produced by changing geometry with a thickness or a combination of a thickness and a width.

For example, when a thickness is changed, a lead frame partially having a thickness of about 70 μm may be formed by, for example, half etching a part of a lead frame with a thickness of 150 μm. In this case, the lead frame with the thickness of 150 μm may be the lead 11a with high rigidity, and the lead frame with the thickness reduced to about 70 μm by for example half etching, may be the lead 11a with low rigidity.

Figure 5:
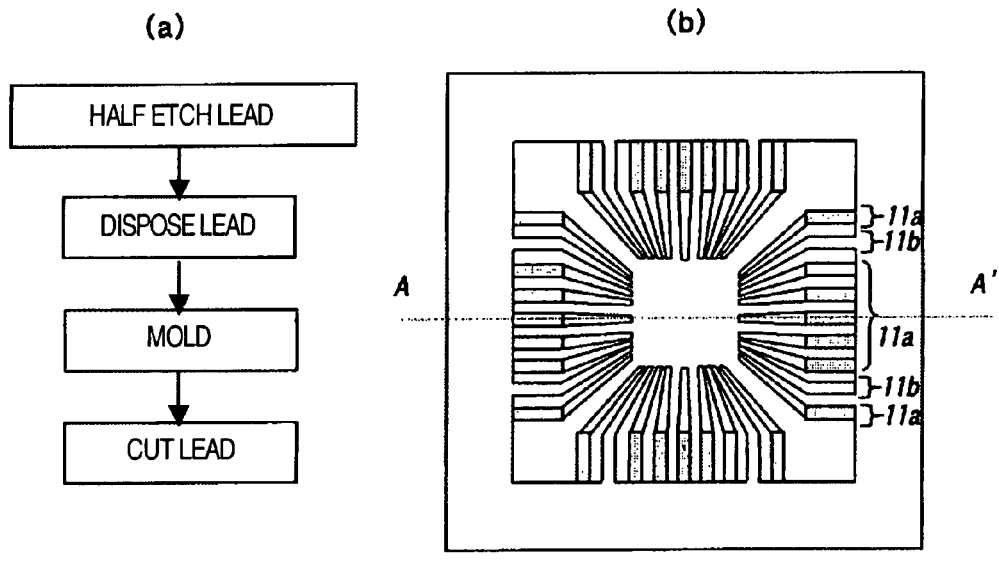
In FIG. 5, (a) is a flow chart illustrating a manufacturing process for the lead type semiconductor device according to the third embodiment, and (b) shows a top view of a lead frame after a half etching process of leads and a cross-section view taken along a dotted line A-A'.
Figure 5:

FIG. 5 shows a specific example of a manufacturing method of the semiconductor device according to this third embodiment.

First, as shown in a flow chart of FIG. 5 (*a*), in a normal lead frame, leads disposed at portions where tensile force due to substrate warpage during implementation on a substrate is strong, are half etched at their ends to form thinner ends of the leads. FIG. 5 (*b*) shows a top view of the lead frame and a cross-section view taken along the dotted line A-A' in this step. Next, this lead frame is disposed, a semiconductor chip is mounted on a tab thereof, and electrodes of the semiconductor chip are electrically connected to the lead ends of the lead frame by wire bonding. Subsequently, after the semiconductor chip portion is molded with resin etc., and a part of the lead frame is cut away, thus manufacturing the semiconductor device according to the third embodiment.

Figure 6:
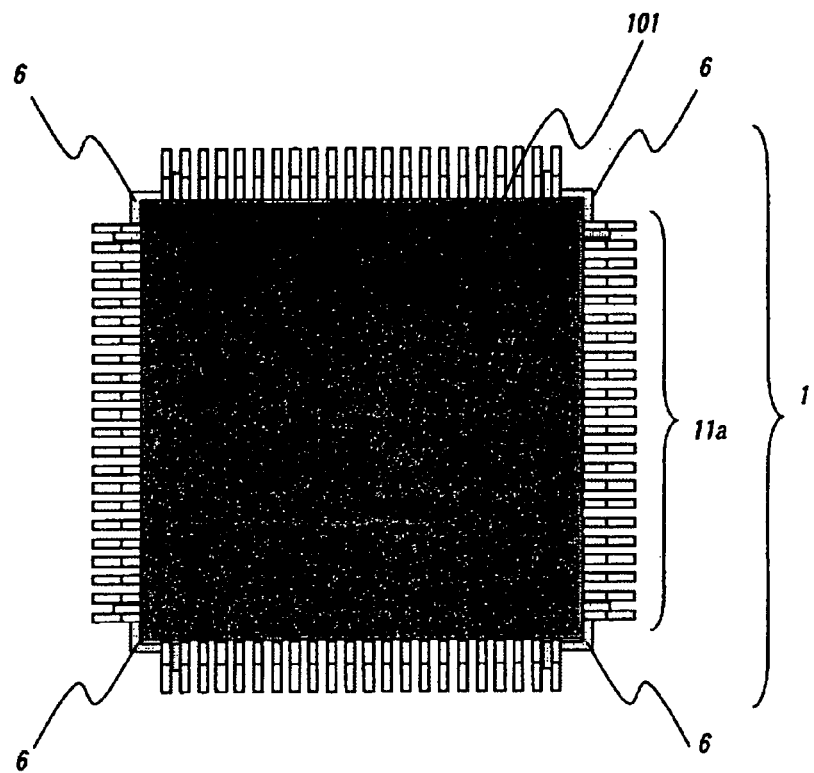
FIG. 6 is a top view of a lead type semiconductor device according to a fourth embodiment.

In a fourth embodiment according to the invention, as shown in FIG. 6, a semiconductor device includes a plurality of leads 11a electrically connected to electrodes of a semiconductor chip (not shown) and having low rigidity, a support member 6 for supporting the leads 11a, and a package portion 101 formed of resin etc. for implementing the semiconductor chip. In this embodiment, while use of the leads all having low rigidity allows adaptation to substrate warpage to be maintained, supporting the leads by the support member 6 of an insulating body may prevent lead deformation or short-circuit between the leads due to the deformation.

More specifically, sheet material or wire material having heat resistance, insulation and lubricity such as TEFLON® brand polytetrafluoroethylene material is passed through a gap between the leads for support and reinforcement. With this construction, when force parallel to a plane of the substrate is applied to the component, a gap distance between two leads directly clipping the sheet material or wire material therebetween may not be likely to change largely beyond a thickness of the sheet material or a cross-section size of the wire material (a diameter when the cross-section of the wire material is circular). Because the leads directly clipping as described above are not displaced, a gap distance between two further leads adjacent to each other may, similarly, not be likely to be displaced largely. Therefore, when the sheet material or wire material is clipped anywhere in one side of the component, this may generally reduce a probability of occurrence of short-circuit between the leads in the one side.

Figure 9:
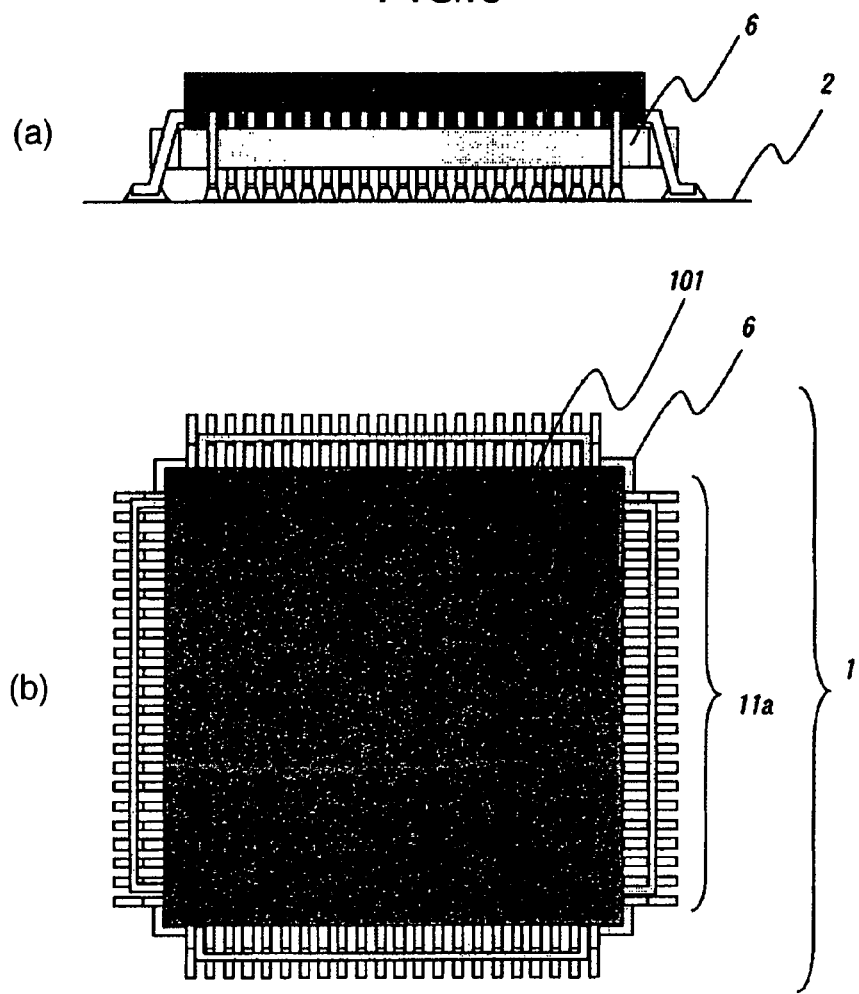
In FIG. 9, (a) is a side view of another lead type semiconductor device according to the fourth embodiment, and (b) is a top view of the device.

Thus, a support member such as sheet material or wire material is clipped in each side (four sides when QFP) of a component in at least one place, short-circuit between leads may be prevented entirely in the component. It goes without saying that the support member may be clipped in a plurality of places for reinforcement. Further, as shown in FIG. 9, a support member 6 such as a Teflon sheet may be provided entirely around a semiconductor device.

The sheet material or wire material desirably has heat resistance of about 300° C., to implement soldering such as reflow soldering. Further, in addition to this, it is necessary for the sheet material or wire material to have insulation because they are in contact with the leads which carry different electrical signals respectively. Moreover, the sheet material or wire material desirably has lubricity in order that each of the leads adjacent to each other in the component may be deformed independently when substrate warpage occurs.

Figure 7:
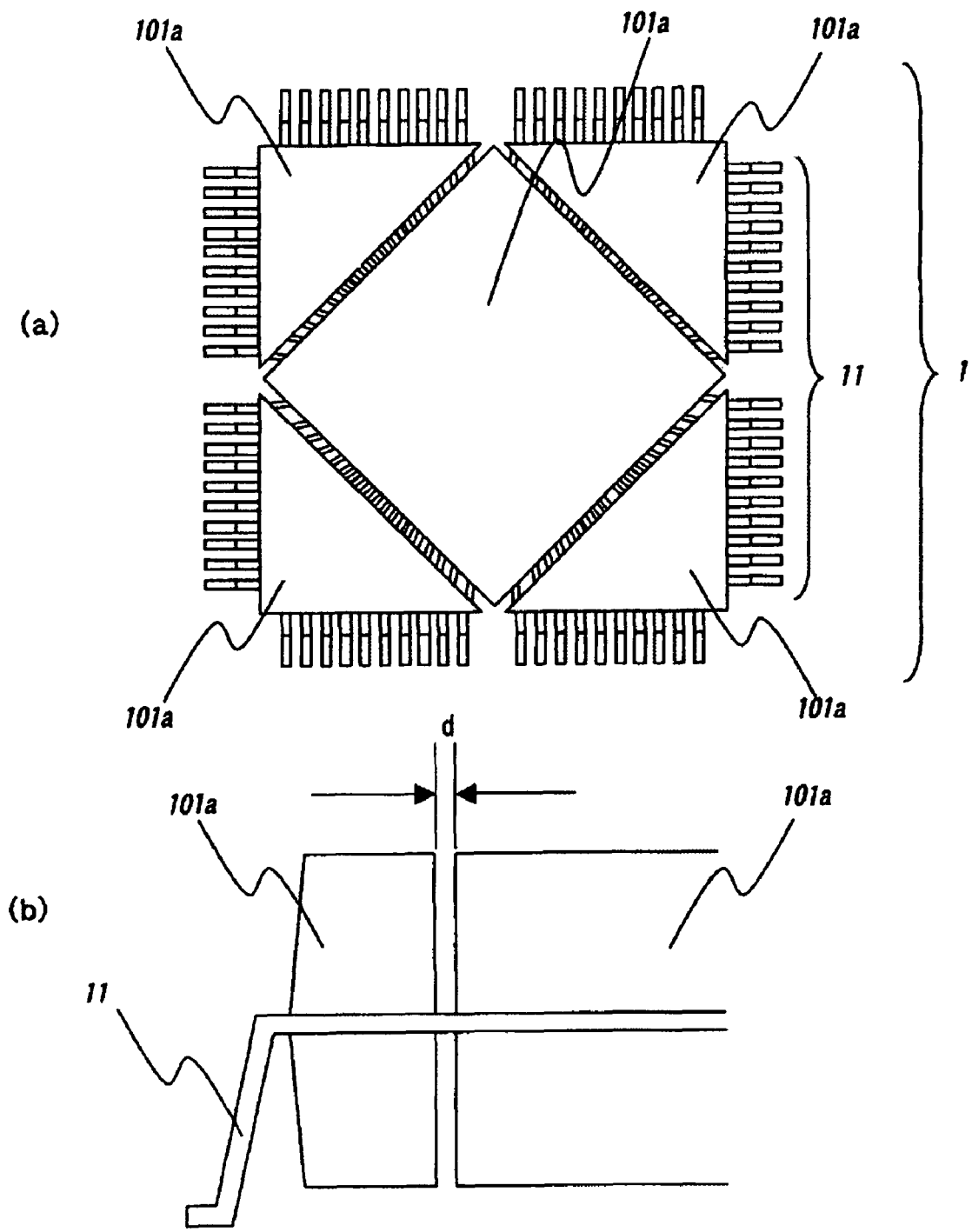
In FIG. 7, (a) is a top view of a lead type semiconductor device according to a fifth embodiment, and (b) is an enlarged cross-section view of an end thereof.

In a fifth embodiment according to the invention, as shown in FIGS. 7 (*a*) and (*b*), a semiconductor device includes a plurality of leads 11 electrically connected to electrodes of a semiconductor chip (not shown), and a package portion 101 formed of resin etc. for implementing the semiconductor chip, and the package portion is divided into small pieces 101a. By dividing the package portion into the small pieces with a size of about 15 mm to 20 mm to produce a gap therebetween, the entire package may adapt to substrate warpage without use of different lead material or support member. This gap may be easily formed by using a suitable mold upon molding.

Figure 8:
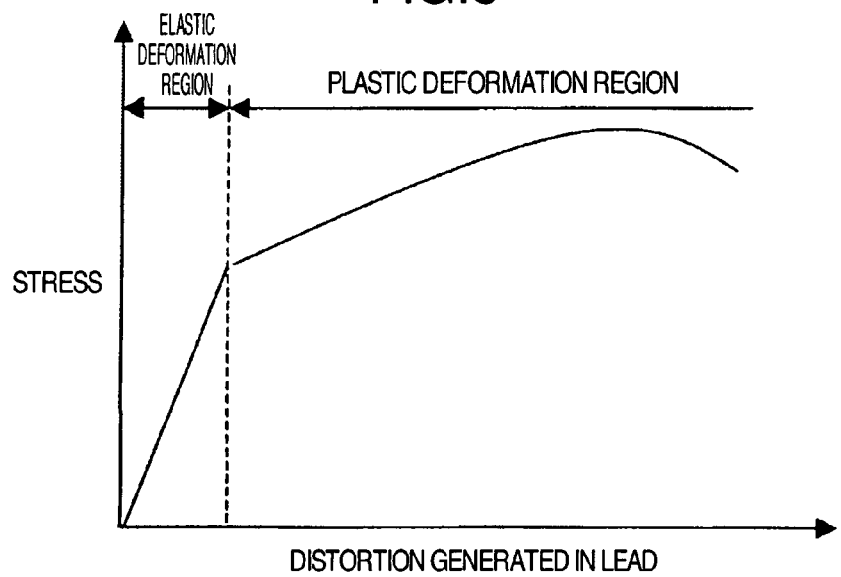
FIG. 8 is a diagram showing a stress-distortion curve when a large distortion is applied to leads lying between small pieces.

In addition, it is necessary to determine a gap distance d between each of the small pieces within the distortion range in which leads lying between the small pieces may be deformed elastically without plastic deformation. It is desirably within the range of about 10 μm to 100 μm, though dependent on a chip size. When the gap distance is set to this extent, if impactive force is applied unavoidably during part installation, only a small distortion may be applied to the leads lying between the small pieces, so that the leads undergo only elastic deformation (FIG. 8), and therefore, after installation, the leads lying between the small pieces will recover the original shape, not causing poor solder connection. On the other hand, when the distance excesses this value, a large distortion may act on the leads lying between the small pieces and they will be deformed plastically, thus causing poor solder connection.

In addition, an elastic body such as silicon rubber may be inserted into the entire gap between each of the small pieces or into a part thereof. In this case, because the leads and the silicon rubber constitute a complex elastic body, a large distortion may not cause a problem, and if the gap distance is not smaller than 100 μm, this makes no problem.

Further, when a size of the package to be divided is not greater than 15 mm, the number of divided pieces increases, presenting a problem that a process for molding the package gets complicated, and a function for preventing peeling of a component may not be improved largely. On the contrary, when the size exceeds 20 mm, adaptation may not be sufficient. Therefore, the size is desirably about 15 mm to 20 mm.

Now, several embodiments have been described, further, these embodiments may be combined in a possible range, for example, a combination of the first embodiment and the fourth embodiment. In addition, each embodiment has been explained taking a semiconductor device in which a semiconductor chip is installed as an example, but not limited to this, each embodiment is applicable similarly to any electronic component having leads such as a capacitor or transistor. Moreover, in each embodiment, a component having leads in four sides is shown, but as we all know, each embodiment is similarly applicable to a component with leads in two sides.

Next, an electronics device in which the electronic component such as a semiconductor device or component having a LSI package etc. according to each embodiment described above is implemented on a wiring board such as a printed board or mother board will be explained.

Figure 11:
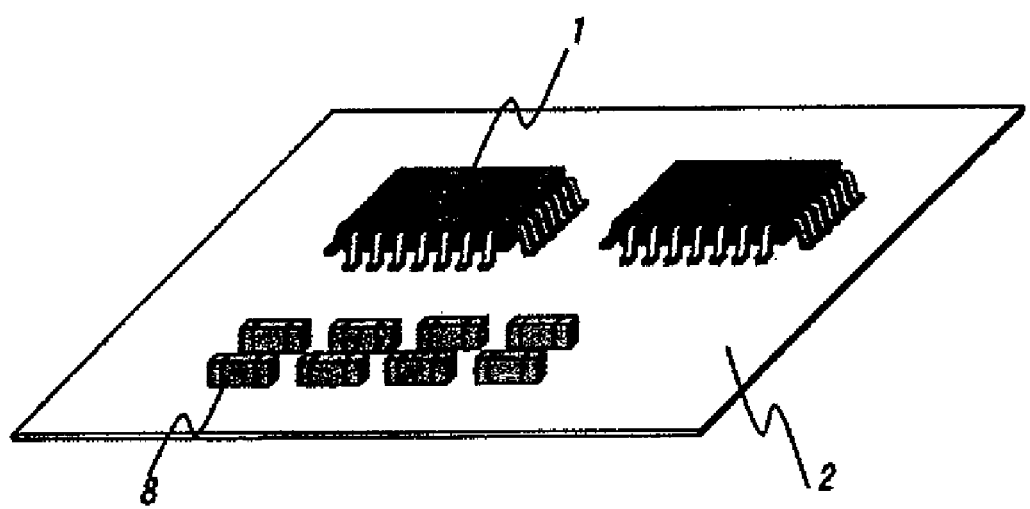
FIG. 11 is a perspective view of an electronics device in which the lead type electronic components of the invention are installed.

FIG. 11 shows the electronics device in which a plurality of semiconductor devices 1 and a plurality of chip components 8 according to any of embodiments above are implemented on the wiring board 2 by a reflow soldering process. As not shown here, lead portions of the semiconductor devices 1 and lead portions of the chip components 8 are electrically connected to electrodes on the wiring board 2 through solder connections. When the semiconductor devices 1 and the chip components 8 of the invention are placed in high-temperature environments of the subsequent wave-soldering process, because the leads 11a having low rigidity are disposed at portions where easy adaptation to displacement from the wiring board in the Z-direction is required, and the leads 11b having high rigidity, to reinforce lead strength, are disposed at portions where easy adaptation to displacement in the Z-direction is not required, substrate warpage may not cause peeling of the components, providing the electronics device with high connection reliability.

Now, the results of experiments performed specifically will be shown below.

Experimental Example 1

Soldering was conducted on two kinds (specified below) of QFP (Quad Flat Package) (specified below) to study frequency of occurrence of peeling of the QFP caused by warpage of a circuit board due to a heat effect of wave-soldering, in a process that after the QFP is reflow-soldered onto the circuit board having a thickness of 1.6 mm and six layers, using Sn-4Ag-0.5Cu-7In alloy solder (unit: weight %) (solidus temperature: 198° C., liquidus temperature: 211° C.), a bottom surface of the circuit board is wave-soldered, using Sn-3Ag-0.5Cu alloy solder (unit: weight %), at solder temperature of 250° C., at a conveyor speed of 0.5 to 1.2 m/min.
Two Kinds of QFP
(1) All leads are formed of Alloy 42.
(2) Ten leads from both of a right corner and a left corner of the component and twenty leads in the center part are formed of copper having rigidity lower than that of Alloy 42, and the other leads are formed of Alloy 42.
QFP Specification
package size: 32 mm square
lead pitch: 0.5 mm
lead width: 0.2 mm
the number of leads: 240
lead plating: Sn-10Pb alloy
As the result, temperature conditions at connection portions of the QFPs for preventing peeling of the components (the highest temperatures in the range without occurrence of peeling of the components) were as follows, respectively.
For the case (1): 153° C. maximum
For the case (2): 162° C. maximum
From the result, it is found that provision of a combination of the leads having two or more kinds of rigidity may have an advantageous effect to reduce frequency of occurrence of peeling of the surface mount component with the leads which will caused by warpage of the circuit board due to a heat effect of the wave-soldering.

Experimental Example 2

Soldering was conducted on two kinds (specified below) of QFP (specified below) to study frequency of occurrence of peeling of the QFP caused by warpage of a circuit board due to a heat effect of wave-soldering, in a process that after the QFP is reflow-soldered onto the circuit board having a thickness of 1.6 mm and six layers, using Sn-4Ag-0.5Cu-7In alloy solder (unit: weight %) (solidus temperature: 198° C., liquidus temperature: 211° C.), a bottom surface of the circuit board is wave-soldered, using Sn-3Ag-0.5Cu alloy solder (unit: weight %), at solder temperature of 250° C., at a conveyor speed of 0.5 to 1.2 m/min.
Two Kinds of QFP
(1) Leads have a thickness of 150 μm and are formed of Alloy 42.
(2) Ten leads from both of a right corner and a left corner of the component and twenty leads in the center part have a thickness of 70 μm, and the other leads have a thickness of 150 μm and are formed of Alloy 42.
QFP Specification
package size: 32 mm square
lead pitch: 0.5 mm
lead width: 0.2 mm
the number of leads: 240
lead plating: Sn-10Pb alloy
As the result, temperature conditions at connection portions of the QFPs for preventing peeling of the components (the highest temperatures in the range without occurrence of peeling of the components) were as follows, respectively.
For the case (1): 153° C. maximum
For the case (2): 161° C. maximum
From the result, it is found that a thinner thickness of the leads for lowering lead rigidity may have an advantageous effect to reduce frequency of occurrence of peeling of the surface mount component with the leads which will be caused by warpage of the circuit board due to a heat effect of the wave-soldering.

Experimental Example 3

Components listed below (lead material: copper) were reflow-soldered onto a circuit board having a thickness of 1.6 mm and six layers, using Sn-4Ag-0.5Cu-7In alloy solder (unit: weight %) (solidus temperature: 198° C., liquidus temperature: 211° C.)
(Component A)
part name: QFJ (Quad Flat J-lead Package)
package size: 28 mm square
lead pitch: 1.27 mm
lead width: 0.6 mm
lead thickness: 0.15 mm
the number of leads: 84
lead plating: Sn-10Pb alloy
(Component B)
part name: QFJ
package size: 24 mm square
lead pitch: 1.27 mm
lead width: 0.6 mm
lead thickness: 0.15 mm
the number of leads: 68
lead plating: Sn-10Pb alloy
(Component C)
part name: QFP
package size: 40 mm square
lead pitch: 0.5 mm
lead width: 0.2 mm
lead thickness: 0.15 mm
the number of leads: 304
lead plating: Sn-10Pb alloy
(Component D)
part name: QFJ
package size: 20 mm square
lead pitch: 1.27 mm lead width: 0.6 mm
lead thickness: 0.15 mm
the number of leads: 52
lead plating: Sn-10Pb alloy
(Component E)
part name: QFP
package size: 20 mm square
lead pitch: 0.5 mm
lead width: 0.2 mm
lead thickness: 0.15 mm
the number of leads: 144
lead plating: Sn-10Pb alloy The five components above were reflow-soldered onto the circuit board having a thickness of 1.6 mm and six layers, using Sn-4Ag-0.5Cu-7In alloy solder (unit: weight %) (solidus temperature: 198° C., liquidus temperature: 211° C.). Subsequently, a bottom surface of the circuit board was wave-soldered, using Sn-3Ag-0.5Cu alloy solder (unit: weight %), at solder temperature of 250° C., and at a conveyor speed of 0.5 to 1.2 m/min. Then, it was found that when the components A, B and C reached temperature of 160° C. at their own connection portions, peeling of the components were caused by warpage of the circuit board due to a heat effect of the wave-soldering.

Then, measuring the substrate warpage, the warpage having a local, the maximum curvature radius of 1.3 m was caused, and in these circumstances, we found out the maximum value of a component of peeling force in the vertical direction acting on a surface of the circuit board at each of the component connection portions. The result was:
(component A) 16.7 MPa
(component B) 14.2 MPa
(component C) 13.4 MPa
(component D) 11.6 MPa
(component E) 8.0 MPa.

In the above, in the cases of the peeled components A, B and C, the component force in the vertical direction excesses about 12 MPa. Then, in order to prevent the components from peeling, lead specifications for the respective peeled components were partially modified as below to adjust rigidity of the leads. These components are called "A'", "B'", and "C'".
(Component A')
positions at which the rigidity of leads is adjusted: four leads from both of a right corner and a left corner of the component, and seven leads in the center portion
lead width: 0.4 mm
lead thickness: 0.11 mm
(Component B')
positions at which the rigidity of leads is adjusted: two leads from both of a right corner and a left corner of the component, and five leads in the center portion
lead width: 0.4 mm
lead thickness: 0.11 mm
(Component C')
positions at which the rigidity of leads is adjusted: fourteen leads from both of a right corner and a left corner of the component, and twenty-four leads in the center portion
lead width: 0.2 mm
lead thickness: 0.10 mm In this case, in conditions that substrate warpage having a local, maximal curvature radius of 1.3 m was caused, we found out the maximum value of a component of connection portion peeling force in the vertical direction acting on a surface of the circuit board at each of the component connection portions. It was found that the maximum values were improved as follows.

(Component A')
11.7 MPa
(Component B')
10.5 MPa
(Component C')
9.1 MPa

Then, five kinds of component A', B', C' on which the lead specifications were modified similarly to the above, and D and E were reflow-soldered onto a circuit board having a thickness of 1.6 mm and six layers, using Sn-4Ag-0.5Cu-7In alloy solder (unit: weight %) (solidus temperature: 198° C., liquidus temperature: 211° C.).

Subsequently, a bottom surface of the circuit board was wave-soldered, using Sn-3Ag-0.5Cu alloy solder (unit: weight %), at solder temperature of 250° C., and at a conveyor speed of 0.5 to 1.2 m/min. Then, it was found that even when all the components reach temperature of 160° C. at their own connection portions, peeling from the circuit board was not caused by warpage of the circuit board due to a heat effect of the wave-soldering.

Experimental Example 4

In a process that after a QFP specified below is reflow-soldered onto a circuit board having a thickness of 1.6 mm and six layers, using Sn-4Ag-0.5Cu-7In alloy solder (unit: weight %) (solidus temperature: 198° C., liquidus temperature: 211° C.), a bottom surface of the circuit board is wave-soldered, using Sn-3Ag-0.5Cu alloy solder (unit: weight %), at solder temperature of 250° C., and at a conveyor speed of 0.5 to 1.2 m/min, in order to study failure caused in connection portions of a QFP, two kinds of QFP specified as follows were soldered.
QFP Specification:
package size: 32 mm square
lead material: Alloy 42
lead pitch: 0.5 mm
lead width: 0.2 mm
lead thickness: 70 μm
the number of leads: 240
lead plating: Sn-10Pb alloy
Two Kinds of QFP:
(1) a QFP, as shown in FIG. 9, in which a Teflon sheet with a thickness of 10 μm is provided to pass through gaps between eight leads at corners and leads adjacent to and inside of the first leads and go round the component.
(2) a QFP without the Teflon sheet above.

As the result, it was found that temperature conditions at the connection portions of the QFPs to prevent the components from peeling were 161° C., respectively.

However, errors as below were observed in an occurrence ratio of short-circuit between the leads caused by slight lead deformation due to impact during the component installation.
For the case (1): about 1%
For the case (2): 100 ppm.

From the result, it is found that in order to lower an incidence of peeling of a surface mount component with the leads which is caused by warpage of the circuit board due to a heat effect of the wave-soldering, a thinner lead thickness for reducing lead rigidity may have an advantageous effect, and further, because of reinforcement obtained by passing the sheet material having heat resistance, insulation and lubricity such as Teflon through a gap between the leads of the surface mount component which has the leads with low rigidity which are likely to adapt to warpage of the circuit board, there is provided also an advantageous effect that reduces an incidence of poor insulation between leads adjacent to each other caused by lead deformation during the component installation etc.

Experimental Example 5

After QFPs, specified below, were reflow-soldered onto a circuit board having a thickness of 1.6 mm and six layers, using Sn-4Ag-0.5Cu-7In alloy solder (unit: weight %) (solidus temperature: 198° C., liquidus temperature: 211° C.), a bottom surface of the circuit board was wave-soldered, using Sn-3Ag-0.5Cu alloy solder (unit: weight %), at solder temperature of 250° C., and at a conveyor speed of 0.5 to 1.2 m/min.
(Component A)
package size: 32 mm square
lead material: Alloy 42
lead pitch: 0.5 mm
lead width: 0.2 mm
lead thickness: 150 μm
the number of leads: 240
lead plating: Sn-10Pb alloy
(Component B)
package size: 32 mm square
(however, as shown in FIG. 7, the package is divided into small pieces of about 16 mm, and in order to configure leads lying between the pieces in such a range that they may be elastically deformed without plastic deformation, a gap between each of the pieces is set to about 90 μm, so that the component is made to easily adapt to substrate warpage).
lead material: Alloy 42
lead pitch: 0.5 mm
lead width: 0.2 mm
lead thickness: 150 μm
the number of leads: 232
lead plating: Sn-10Pb alloy As the result, temperature conditions at connection portions of the QFPs for preventing peeling of the components (the highest temperatures in the range without occurrence of peeling of the components) were as follows, respectively.
For the case (1): 153° C. maximum
For the case (2): 170° C. maximum From the result, it is found that in order to lower an incidence of peeling of a surface mount component with the leads which is caused by warpage of the circuit board due to a heat effect of the wave-soldering, it is effective that the package is divided into the small pieces to make the component easily adapt to substrate warpage.

As described above, after an electronic component to be surface mounted using lead-free solder is connected to a wiring board by reflow soldering, a bottom surface of the wiring board is wave-soldered, which causes occurrence of substrate warpage. On this occasion, by providing approximately minimum, necessary lead rigidity to support the component so that a solder connection portions may easily adapt to displacement in the Z-direction of a surface of the board, the electronic component may be prevented from peeling.

Further, with reinforcement by passing sheet material having heat resistance, insulation and lubricity such as Teflon through a gap between the leads of an electronic component, an incidence of poor insulation between the leads adjacent to each other which is caused by lead deformation during the component installation owing to lowering of lead rigidity, may be reduced.

As having described above, the invention disclosed herein may provide a compact electronic component having good connection reliability, especially a semiconductor device and electronics device, although in which miscellaneous components are implemented by both of a reflow soldering process and a wave-soldering process.

The invention may be embodied in other specific forms without departing from the sprit or essential characteristics thereof. The present embodiments are therefore to be considered in all respects as illustrative and not restrictive, the scope of the invention being indicated by the appended claims rather than by the forgoing description and all changes which come within the meaning and range of equivalency of the claims are therefore intended to be embraced therein.

The invention claimed is:

1. A semiconductor device comprising:
a semiconductor chip having four side edges, each of the four side edges being located between two adjacent corners, and having a plurality of electrodes;
a plurality of leads electrically connected to the plurality of electrodes of the semiconductor chip by bonding wires; and
a resin for implementing the semiconductor chip,
wherein the plurality of leads include at least a first group of leads, the leads of the first group being directly adjacent one another and having first rigidity and a second group of leads, the leads of the second group being directly adjacent one another and having second rigidity higher than the first rigidity, the first group of leads having first ends provided at a center region of at least the one side edge of the semiconductor chip and adjacent at least one end region of at least the one side edge of the semiconductor chip, and the second group of leads having first ends provided adjacent a region between the center region and the at least one end region of at least the one side edge, such that the leads of the first group are closer to a corner than leads of the second group.

2. The semiconductor device according to claim 1, wherein the first ends of the first group of leads are provided adjacent a center region of at least another side edge of the semiconductor chip and adjacent at least one end region of the another side edge of the semiconductor chip, the first ends of the second group of leads being provided adjacent a region between the center region and the at least one end region of the another side edge.

3. The semiconductor device according to claim 2, wherein the first edge the first group of leads are provided adjacent the center region of the at least the one side edge and the another side edge of the semiconductor chip and adjacent both end regions of the at least the one side edge and the another side edge of the semiconductor chip, and the first ends of the second group of leads are provided adjacent at least the one side edge and the another side edge of the semiconductor chip at a region between the center region and the end regions.

4. The semiconductor device according to claim 1, wherein the first group of leads is formed of material different from that of the second group of leads.

5. The semiconductor device according to claim 4, wherein the first group of leads comprise a Cu material, and the second group of leads comprise a Alloy 42 material.

6. The semiconductor device according to claim 1, wherein each of the leads of the first group of leads has a width different from that of each of the leads of the second group of leads.

7. The semiconductor device according to claim 1, wherein each of the leads of the first group of leads has a thickness different from that of each of the leads of the second group of leads.

8. The semiconductor device according to claim 7, wherein each of the leads of the first group of leads is formed of the same material as that of each of the leads of the second group of leads.

9. The semiconductor device according to claim 1, wherein each of the leads of the first group of leads is formed of the same material as that of each of the leads of the second group of leads and a surface thereof is provided with a metal film.

10. The semiconductor device according to claim 1, wherein the first ends of the first group of leads are provided adjacent the center region of the at least the one side edge of the semiconductor chip and adjacent both end regions of the at least the one side edge of the semiconductor chip, and the first ends of the second group of leads are provided between the center region and the end regions of at least the one side edge.

11. The semiconductor device according to claim 1, wherein the resin seals the semiconductor chip, the bonding wires and the first ends of the plurality of leads to provide a package having two opposed major surfaces and four side edge surfaces, each of the four side edge surfaces being located between two adjacent corners, and wherein second ends of the first group of leads and the second group of leads project outwardly from one of the four side edge surfaces.

12. The semiconductor device according to claim 11, wherein the two opposed major surfaces of the package have a square shape.

13. The semiconductor device according to claim 1, wherein said first group leads is supported by a support member.

14. The semiconductor device according to claim 13, wherein said support member is provided only at a portion to support said first group of leads.

15. The semiconductor device according to claim 13, wherein said support member is provided entirely around the semiconductor device.

16. A semiconductor device comprising:
a semiconductor chip having four side edges, each of the four side edges being located between two adjacent corners, and having a plurality of electrodes;
a plurality of leads electrically connected to the plurality of electrodes of the semiconductor chip by bonding wires; and
a resin for implementing the semiconductor chip,
wherein the plurality of leads include at least a first lead group, the leads of which are directly adjacent one another and have first ends provided at a center region of a first side edge of the semiconductor device, a second lead group, the leads of which are directly adjacent one another and have first ends provided adjacent at least one end region of the first side edge, and a third lead group between the first lead group and the second lead group, the leads of which are directly adjacent one another and have first ends adjacent the first side edge, and the third lead group has rigidity higher than those of the first lead group and the second lead group, such that the leads of the second group are closer to a corner than leads of the first group and leads of the third group.

17. The semiconductor device according to claim 16, wherein the first ends of second group of leads are provided adjacent both end regions of the first side edge of the semiconductor chip, and the first ends of the third group of leads are provided adjacent the first side edge of the semiconductor chip at a region between the center region and the end regions.

18. The semiconductor device according to claim 16, wherein the resin seals the semiconductor chip, the bonding wires and the first ends of the plurality of leads to provide a package having two opposed major surfaces and four side edge surfaces, each of the four side edge surfaces being located between two adjacent corners, and wherein second ends of the first group of leads, the second group of leads and the third group of leads project outwardly from one of the four side edge surfaces.

19. The semiconductor device according to claim 18, wherein the two opposed major surfaces of the package have a square shape.

20. An electronics device comprising:
a wiring board; and
a semiconductor device two opposed major surfaces and four side edge surfaces, each of the four side edge surfaces being located between two adjacent corners and having a plurality of leads electrically connected to a plurality of electrodes of the wiring board,
wherein the plurality of leads of the semiconductor device include a first group of leads, the leads of the first group being directly adjacent one another and have a first rigidity and a second group of leads, the leads of the second group being directly adjacent one another and have a second rigidity higher than the first rigidity, the first group of leads being provided on at least one side of the semiconductor device projecting from a center region of at least one side edge surface of the semiconductor device and from at least one end region of at least the one side edge surface of the semiconductor device, and the second group of leads projecting from a region between the center region and the at least one end region of the at least one side edge surface, such that the leads of the first group are closer to a corner than leads of the second group.

21. The electronics device according to claim 20, wherein the first group of leads extends from a center region of at least another side edge surface of the semiconductor device from at least one end region of the another side edge surface of the semiconductor device, the second group of leads extending from a region between the center region and the at least one end region of the another side edge surface.

22. The electronics device according to claim 21, wherein the first group of leads extends from the center region of the at least the one side edge surface and another side edge surface of the semiconductor device and from both end regions of the at least the one side edge surface and the another side of the edge surface semiconductor device, and the second group of leads extends from at least the one side edge surface and the another side edge surface of the semiconductor device at a region between the center region and the end regions.

23. The electronics device according to claim 20, wherein each of the leads of the first group of leads is formed of material different from that of each of the leads of the second group of leads.

24. The electronics device according to claim 23, wherein each of the leads of the first group of leads comprises a Cu material, and each of the leads of the second group of leads comprises a Alloy 42 material.

25. The electronics device according to claim 20, wherein each of the leads of the first group of leads has a width different from that of each of the leads of the second group of leads.

26. The electronics device according to claim 20, wherein each of the leads of the first group of leads has a thickness different from that of each of the leads of the second group of leads.

27. The electronics device according to claim 26, wherein each of the leads of the first group of leads and each of the leads of the second group of leads are formed of the same material.

28. The electronics device according to claim 20, wherein each of the leads of the first group of leads is formed of the same material as that of each of the leads of the second group of leads and a surface thereof is provided with a metal film.

29. The electronics device according to claim 20, wherein a chip component having a plurality of leads is also installed on the wiring board, and the plurality of leads of the chip component include two or more kinds of leads having rigidity different from each other.

30. The electronics device according to claim 20, wherein the first group of leads extends from both end regions of the at least the one side edge surface of the semiconductor device, and the second group of leads extends from at least the one side edge surface of the semiconductor device at a region between the center region and the end regions.

* * * * *